United States Patent [19]

Valdenaire

[11] Patent Number: 5,677,687
[45] Date of Patent: Oct. 14, 1997

[54] ZERO DC POWER KEYBOARD SCANNER USING BIDIRECTIONAL I/O'S WITH REPEATERS

[75] Inventor: Patrick Valdenaire, Valbonne, France

[73] Assignee: VLSI Technology, Inc., San Jose, Calif.

[21] Appl. No.: 676,557

[22] Filed: Jul. 8, 1996

[51] Int. Cl.$^6$ .......................... H03K 17/94; H03M 11/00
[52] U.S. Cl. ........................ 341/26; 341/22; 341/24; 345/168; 345/174; 364/707; 364/709.12
[58] Field of Search ........................ 341/26, 22, 24; 345/168, 174; 364/707, 709.12

[56] References Cited

U.S. PATENT DOCUMENTS

| | | | |
|---|---|---|---|
| 4,333,089 | 6/1982 | Leininger | 340/365 S |
| 4,701,748 | 10/1987 | Ushiki et al. | 340/365 S |
| 4,728,932 | 3/1988 | Atherton | 340/365 C |
| 4,918,445 | 4/1990 | Bower | 341/26 |
| 5,151,554 | 9/1992 | Matsuda | 84/655 |
| 5,386,584 | 1/1995 | Verstegen et al. | 391/800 |
| 5,424,731 | 6/1995 | Kronberg | 341/26 |
| 5,430,443 | 7/1995 | Mitchell | 341/22 |
| 5,486,824 | 1/1996 | Kinerk et al. | 341/26 |
| 5,541,989 | 7/1996 | Wu et al. | 341/26 |

OTHER PUBLICATIONS

*IBM Technical Disclosure Bulletin*, "Key Coding Arrangement" by F. Buffard, vol. 21, No. 11, Apr. 1979.

*Primary Examiner*—Jeffery Hofsass
*Assistant Examiner*—Timothy Edwards, Jr.
*Attorney, Agent, or Firm*—Sitrick & Sitrick

[57] ABSTRACT

The present invention is directed to a system and methodology where virtually no DC power dissipation is used during keyboard scanning or key closure. This is done by replacing the passive pull-up (or pull down) resistors of previous schemes by input/output (I/O) circuits with repeaters and utilizing a scanning protocol and methodology which take advantage of the bidirectional I/O devices with repeaters. In a preferred embodiment, a plurality of CMOS bidirectional I/O circuits with repeaters are used, one for each row and column line in a switch matrix. A low power, switch activation scanner circuit determines activation of a switch. The circuit is coupled to or may include a plurality of switches, arranged in rows and columns, each row output line intersecting each column output line at a different node, for coupling a first row to a first column at a first node when a first switch of the plurality of switches is activated. A plurality of bidirectional input/output devices is arranged as two sets arranged in a matrix fashion. A first set of the two sets is comprised of a plurality of rows and a second set of the two sets comprising a plurality of columns. Each input/output device is comprised of an input to the input/output device, an output coupled to an output line, an output control for controlling the output of the input/output device such that a predetermined control signal coupled to the output control enables a signal coupled to the input to pass through to the output or places the output in a high impedance state, and a repeater circuit, coupled to the output of the input/output device, for holding the most current signal level at the output when the I/O device output is in a high impedance state.

26 Claims, 5 Drawing Sheets

ZERO DC POWER KEYBOARD SCANNER USING BIDIRECTIONAL I/O'S WITH REPEATERS

BACKGROUND OF THE INVENTION

The present invention relates to switch matrix switch closure detection, and more particularly, to a low power keyboard scanner using a bidirectional input/output device with repeaters to effectuate scanning and detection.

Figure 1:
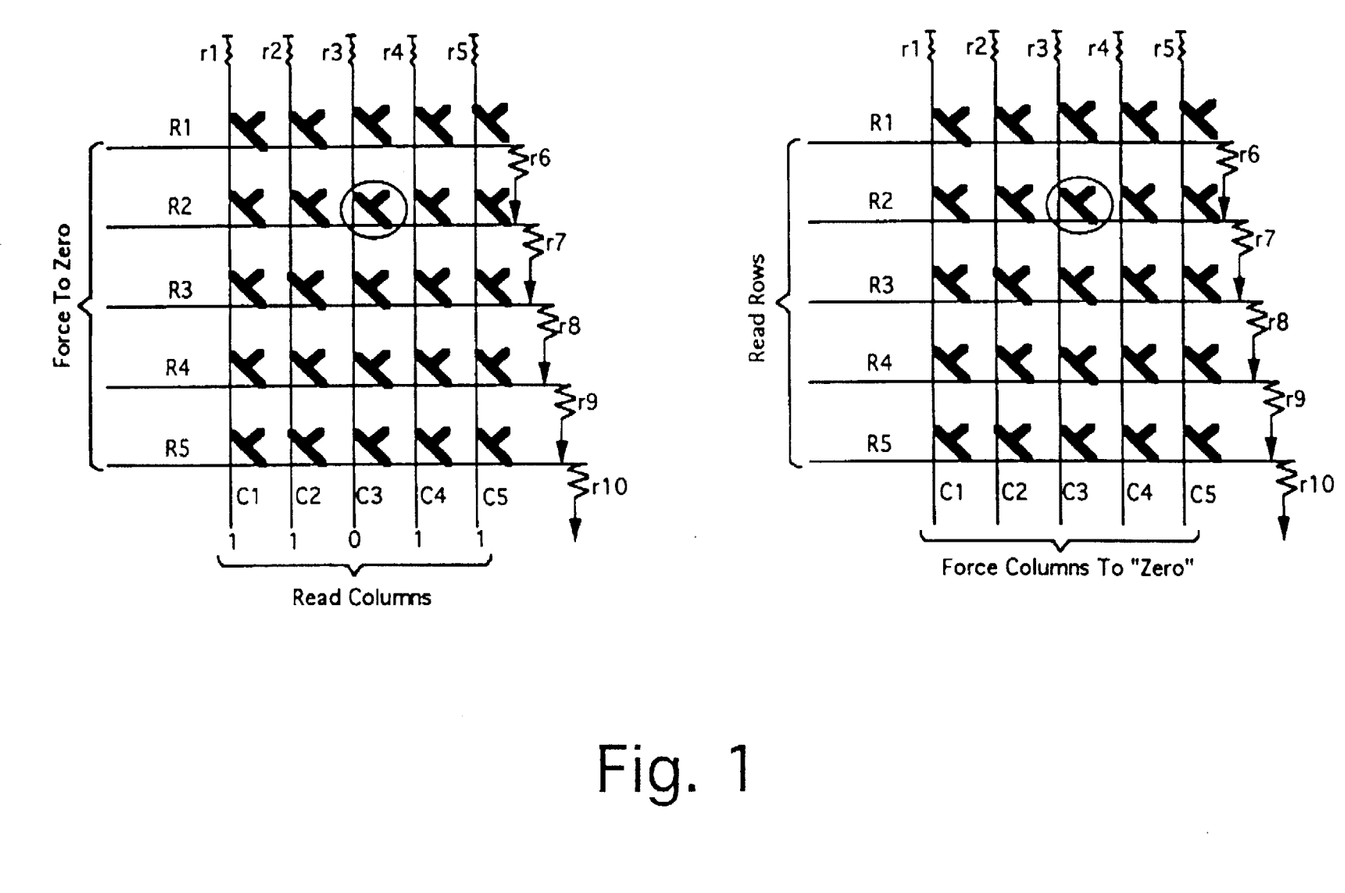
FIG. 1 is a diagram of a prior art 5×5 keyboard scanner circuit using passive pull-up (and pull-down) resistors.

A typical keyboard scanner uses passive pull-ups to detect and encode key closure. FIG. 1 shows a 5×5 matrix keyboard; wherein the five rows (R1 to R5) and five columns (C1 to C5) are pulled to logic high levels by pull-up resistors (r1 to r10)

When a key is depressed a short circuit is established between one row and one column and the corresponding key position can be decoded by the follow sequence:
a) force low level on rows R1 to R5 and observe which column C1 to C5 is pulled low.
b) force low level on columns C1 to C5 and observe which row R1 to R5 is pulled low.

For example, if key K at intersection of row 2 and column 3 is depressed the sequence is:

a) Force R1 to R5 to "zero". The response is C1=C2=C4=C5="one", C3="zero".

b) Force C1 to C5 to "zero". The response is R1=R3=R4=R5="one", R2="zero"

To be able to continuously detect key closure, one needs to force R1 to R5 to "zero" at all times, and columns C1 to C5 will stay at "one" until any key is depressed. In typical implementation, a micro controller is programmed to react to the transition of any C1 to C5 to "zero".

Following a key closure detection; the micro controller will then enter a keyboard scan routine by first decoding the Column at level "zero" and then executing step b) by releasing the Rows R1 to R5 and forcing the columns C1 to C5 to "zero" to be able to decode the corresponding Row. The micro controller routine may be more sophisticated in order to prevent false decoding due to keyboard bouncing and also to treat the case of multiple key closure. The drawback of the proposed scheme is the constant DC power caused by driving "zero" levels on Rows R1 to R5 to which are attached permanent pull-ups.

SUMMARY OF THE INVENTION

The present invention is directed to a system and methodology where virtually no DC power dissipation is used during keyboard scanning or key closure. This is done by replacing the passive pull-up (or pull down) resistor of previous schemes by input/output (I/O) circuits with repeaters and utilizing a scanning protocol and methodology which take advantage of the bidirectional I/O devices with repeaters. In a preferred embodiment, a plurality of CMOS bidirectional I/O circuits with repeaters are used, one for each row and column line in a switch matrix.

A low power, switch activation scanner circuit determines activation of a switch. The circuit is coupled to or may include a plurality of switches, arranged in rows and columns, each row output line intersecting each column output line at a different node, for coupling a first row to a first column at a first node when a fast switch of the plurality of switches is activated. A plurality of bidirectional input/output devices is arranged as two sets arranged in a matrix fashion. A first set of the two sets is comprised of a plurality of rows and a second set of the two sets comprising a plurality of columns. Each input/output device is comprised of an input to the input/output device, an output coupled to an output line, an output control for controlling the output of the input/output device such that a predetermined control signal coupled to the output control enables a signal coupled to the input to pass through to the output or places the output in a high impedance state, and a repeater circuit, coupled to the output of the input/output device, for holding the most current signal level at the output when the I/O device output is in a high impedance state.

A scanning methodology and interface protocol is provided to sequence the I/O device outputs, so as to set and hold repeater levels on the column (or row) set, then set outputs on the row (or column) set, then look for a change of one of the column (or row) set of repeaters, and then repeat the process, but with row and column sets reversed. The method is comprised of the steps of changing the outputs of the column set of input/output devices to a low impedance state; inputting a logical high to the input/output devices of the column set; changing the outputs of the input/output devices of the column set to a high impedance state; retaining the logical high in a repeater circuit coupled to the output of each input/output device in the column set; changing the outputs of the row input/output devices to a low impedance state; inputting a logical low to the input/output devices of the row set; detecting a change of state in the repeater circuits of the column set; changing the outputs of the input/output devices of the row set to a logical low level low impedance state; changing the outputs of the input/output devices of the row set to a high impedance state; changing the outputs of the input/output devices of the column set to a low impedance state; retaining the logical low state in the repeater circuits of the row set; detecting the change of state in the repeater circuits of the row set; and processing the detected change of state in the repeater circuits of the row and column sets to identify the activated key.

These and other aspects and attributes of the present invention will be discussed with reference to the following drawings and accompanying specification.

DETAILED DESCRIPTION OF THE PREFERRED EMBODIMENT

While this invention is susceptible of embodiment in many different forms, there is shown in the drawings, and will be described herein in detail, specific embodiments thereof with the understanding that the present disclosure is to be considered as an exemplification of the principles of the invention and is not intended to limit the invention to the specific embodiments illustrated.

FIG. 1 illustrates a prior art keyboard scanner circuit using passive pull-up resistors, and operating in the manner as described above herein relating to FIG. 1.

Figure 2:
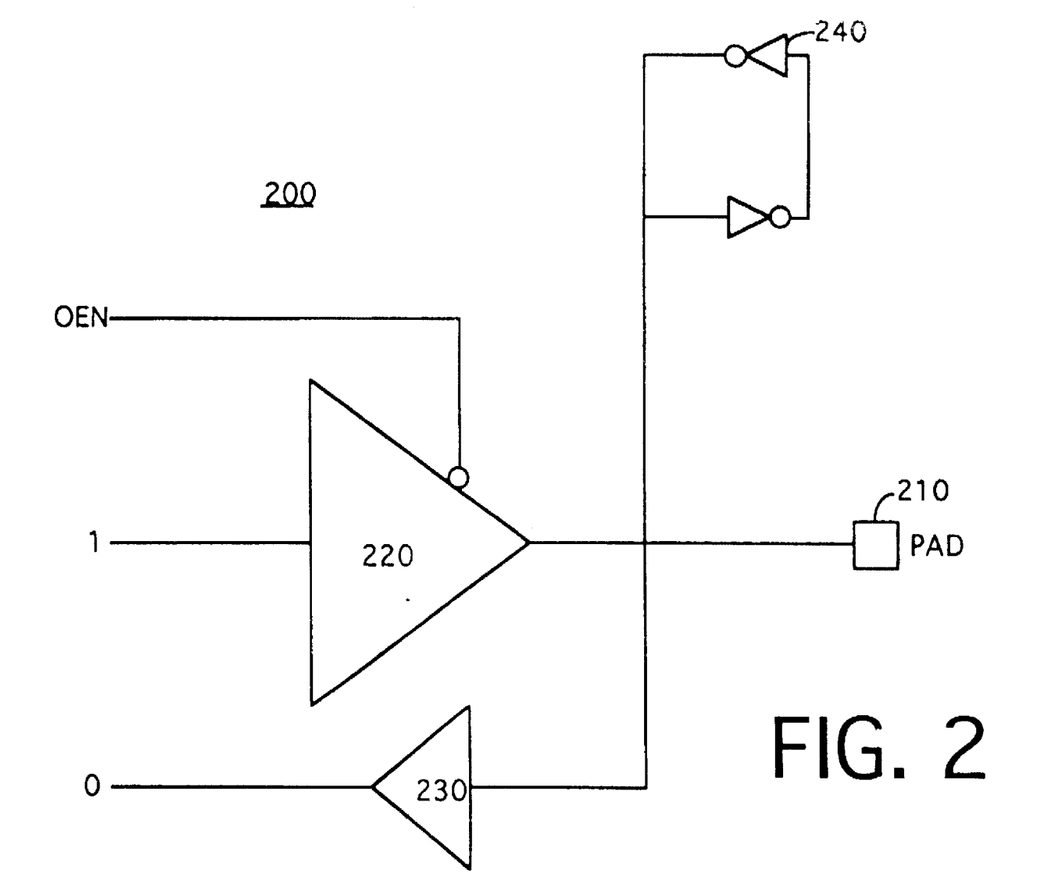
FIG. 2 is a CMOS bi-directional I/O with repeater subsystem circuit for use in a keyboard scanner circuit in accordance with the present invention.

FIG. 2 illustrates a CMOS bi-directional I/O device with repeater (200) used in the preferred embodiment of the switch scanner circuit of the present invention.

Referring to FIG. 2, the structure and mode of operation of CMOS Bidirectional I/O is described. The pin PAD (210) is external and provides for bi-directional signal flow coupling to the switch matrix lines coupled to the rows and columns of switches. The drive of the output from input section (220) to the PAD is controlled by signal OEN (output enable). When OEN="zero", the I/O device input section (220) provides an output to the PAD (210) corresponding to the input I. When OEN="one", the output from the I/O device input section (220) goes to a high impedance state and the PAD (210) maintains its immediately preceding signal logic level due to the repeater (240). Tills level remains until overridden by another (e.g., an external) signal level that is applied to the PAD. Output section (230) of the I/O device (200) provides an output O corresponding to the signal level at the PAD (210).

The advantage of the repeater compared to passive pull up/pull down is that it can maintain either a "zero" or a "one" level. The repeater must be sized appropriately; strong enough not to flip state by pure capacitive coupled noise to the PAD and sized to minimize the amount of current during the state transition. A great deal of flexibility and versatility is possible. This sizing depends on the CMOS technology, such as operating supply voltage and noise immunity versus transient current tradeoff. It can be defined with the I/O library requirements for the CMOS circuit Also, the optimum P/N ratio for the repeater should be applied to maximize noise margins.

Figure 3A:
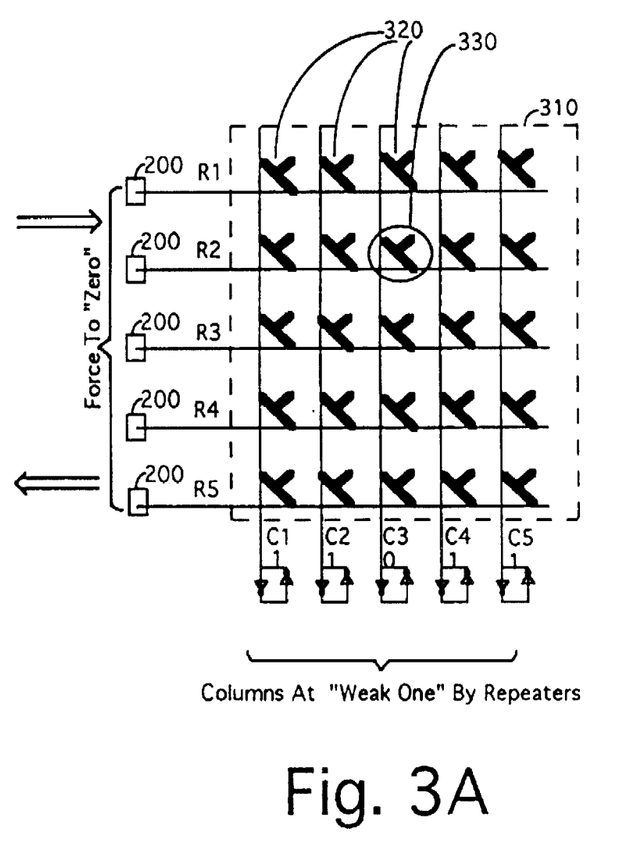
FIGS. 3A–3B illustrate a 5×5 keyboard scanner circuit diagram utilizing I/O devices with repeaters to interface to the switch matrix lines R1–R5 and C1–C5, and also illustrate the state flow of the circuit's operation.
Figure 3B:
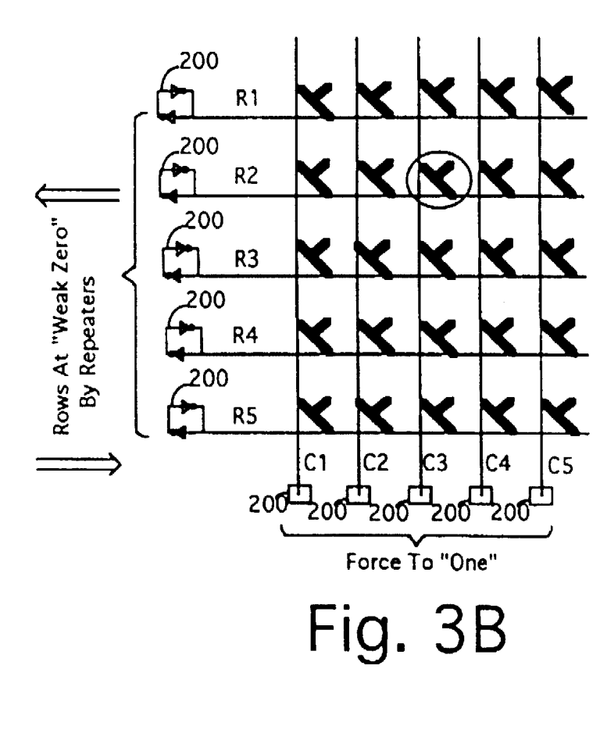

FIGS. 3A-B illustrate a switch matrix (310) coupled to a plurality of input/output devices with repeaters (200) in accordance with the present invention, and shows the scanning protocol state flow sequence.

The switch matrix (310) is comprised of a plurality of switches (320) comprising two sets arranged in a matrix fashion, a first set of the two sets comprising a plurality of rows (R1 to R5) and a second set of the two sets comprising a plurality of columns (C1 to C5), the plurality of rows and columns intersecting at a plurality of nodes, for coupling a respective row to a respective column at a respective node when a respective switch of the plurality of switches is activated. All switches in each row (or column) are adapted for common coupling (when activated) to a respective switch matrix line for that row (or column) which couples to a respective I/O device with repeater (200). Typically, each of the plurality of switches are coupled to a different key of a keyboard.

A plurality of bidirectional input/output devices (200) are coupled to the switch matrix. The plurality of devices are comprised of two sets, a first set coupling each device in the set to a respective one of the lines of the plurality of rows (R1 to R5) and a second set coupling each devices in the set to a respective one of the lines of the plurality of columns (C1 to C5). Each input/output device (200) is comprised of (a) an input (I of FIG. 2) to the input/output device (200), (b) an output (210) coupled to an output line, each row output line intersecting each column output line at a different node, (c) an output control for controlling the output of the input/output device such that a predetermined control signal (OEN of FIG. 2) coupled to the output control enables an input signal coupled to the input to pass through to the output and otherwise provides a high impedance output level to the output of the input/output device, (d) a received output O coupled to the output line for communicating back to a host the state of the output line, and (e) a repeater circuit, coupled to the output of the input/output device, for holding on the output a predetermined signal level present at the output in response to the output control providing the high impedance output level.

The input signal can be one of either a logical high or a logical low. The predetermined control signal can be one of either a logical high signal or a logical low signal, the logical high signal causing the output of the input/output device to take on high impedance characteristics and the logical low signal causing the output of the input/output device to take on a low impedance state. Alternatively, the opposite states can be used for control.

The repeater circuit (240) is shown as comprised of two invertor gates, each having an input and output, the two inverter gates coupled such that a first inverter gate has its output coupled in series to the input of a second inverter gate, and the output of the second inverter gate is coupled to the input of the first inverter gate which is also coupled to the output line PAD of the input/output device, as illustrated in FIG. 2

The operation of the keyboard scanner of the present invention is described with reference to FIGS. 3A-3B. Referring to FIG. 3A, 1) Weak "one" levels are applied to column C1 to C5 by first driving corresponding I/O device (200) outputs to low impedance "one" (OEN=0 & I=1) and then causing these outputs to go high impedance (OEN=1); concurrently, rows R1 to R5 are forced to low impedance "zero" (OEN=0 & I=0).

2) Any valid key closure will momentarily short circuit a Row to a Column and flip the corresponding column repeater to "zero". For example, as shown in FIGS. 3A and 3B, when switch (330) is activated, column line C3 is flipped to zero because the zero level signal on row line R2 is coupled to the repeater coupled to column line C3 via switch (330). Column encoding can be done by reading a column input port (see, for example, port (410) of FIG. 4) coupled to the plurality of I/O devices (200) as coupled to the columns (lines) of the switch matrix (also referred to as the column set of I/O devices).

Referring now to FIG. 3B:

3) Upon detection of the change of state on the column repeater, the program routine can be completed by setting rows R1 to R5 to Weak "zero" (OEN=1, I=0) and then forcing columns C1 to C5 back to low impedance "one" (OEN=0 & I=1).

4) the key closure (switch 330) will then couple the one level from the column line C3 to the row line R2 causing it to flip the signal level of the repeater coupled to the row line R2 to "one". Row encoding can be done by reading the row input port Note that two repeaters will flip state during the complete sequence 1) to 4) whenever a single key is depressed. The total associated energy is 2*W01+2*W10 where W01 is the energy required to flip a repeater for 0 to 1 transition and W10 is the energy for 1 to 0 transition. Half is due to the actual key closure and other half is due to restoring output levels when the I/O device (200) output goes to low impedance, assuming that transitions are abrupt enough to neglect DC current flow through input buffer during transition, which presumes that the keyboard switches and the output drivers are low impedance (which is perfectly legitimate). If no key is depressed, then no repeater changes state, therefore no DC power is dissipated.

Figure 4:
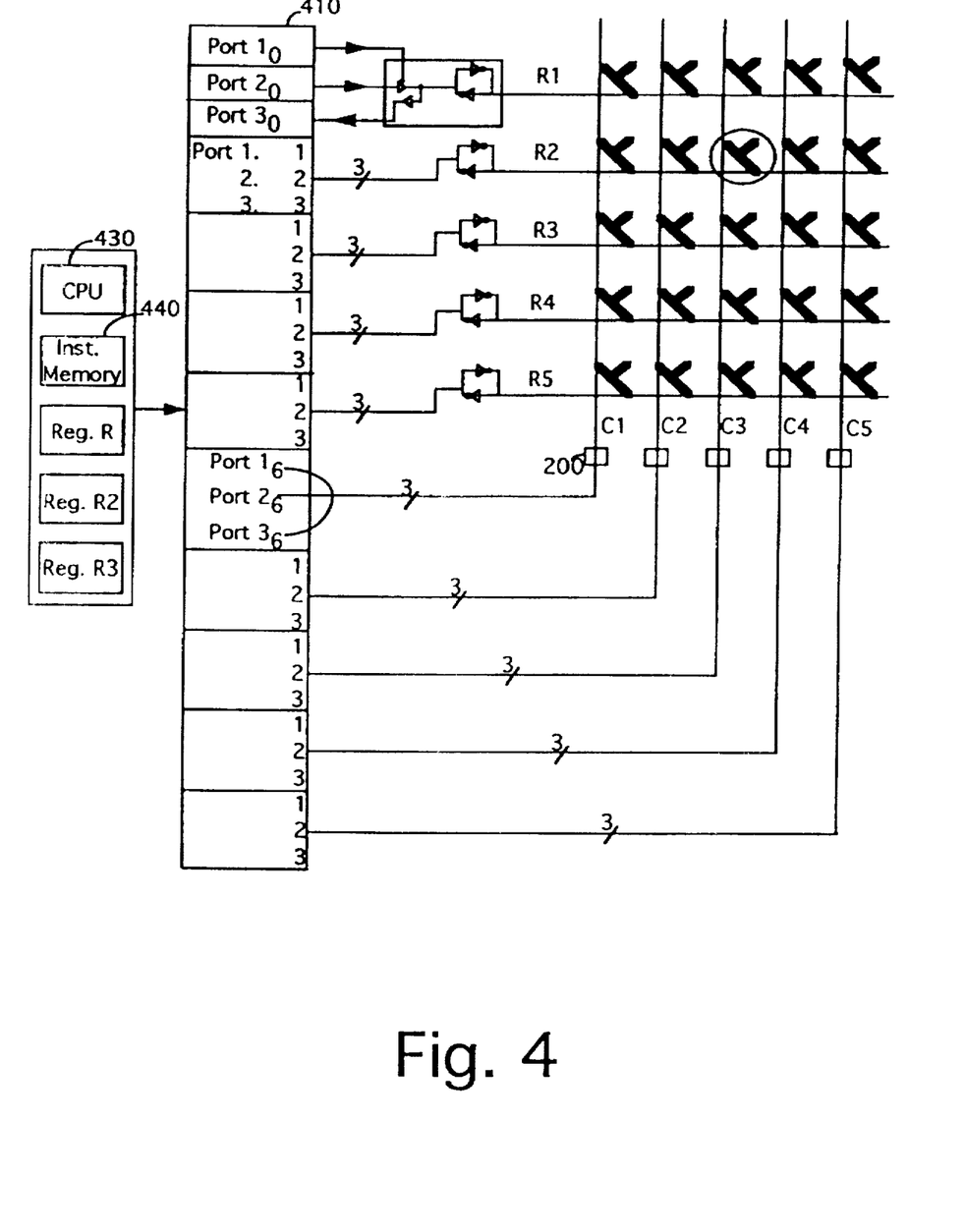
FIG. 4 illustrates a system including a system including a processor unit for providing keyboard scanning operation in accordance with the present invention.

Referring to FIG. 4, this sequencing can he implemented via a controlled state machine, such as a microprocessor system. A processor CPU (430) is responsive to program instruction memory (440), outputs signals (I and OEN), and reads key closure flipped signals (0) from the I/O device (200) in the sequence as described above and hereafter, such as via I/O port device (or devices) (410).

Figure 5A:
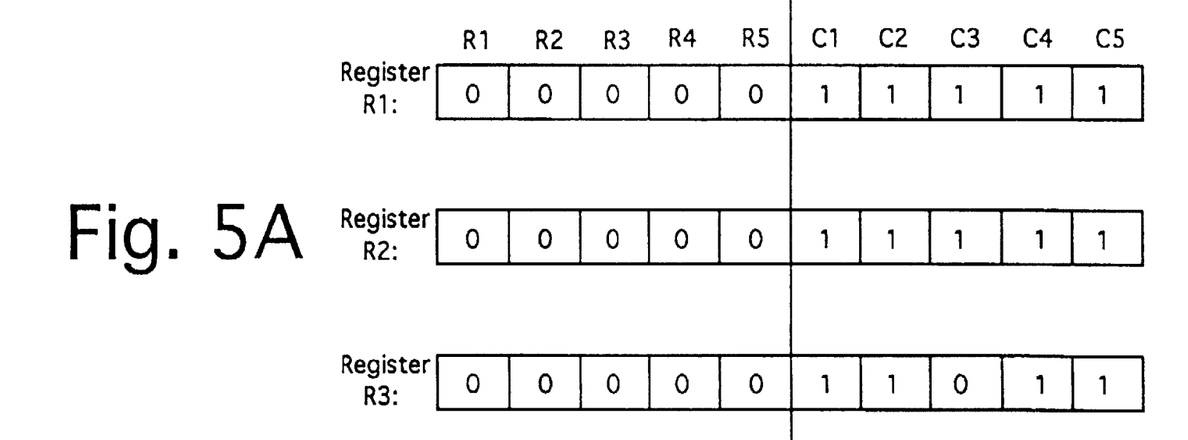
FIGS. 5A–5B illustrate the control registers operation and slate flow to accomplish keyboard scanning and detection in accordance with the present invention.
Figure 5B:
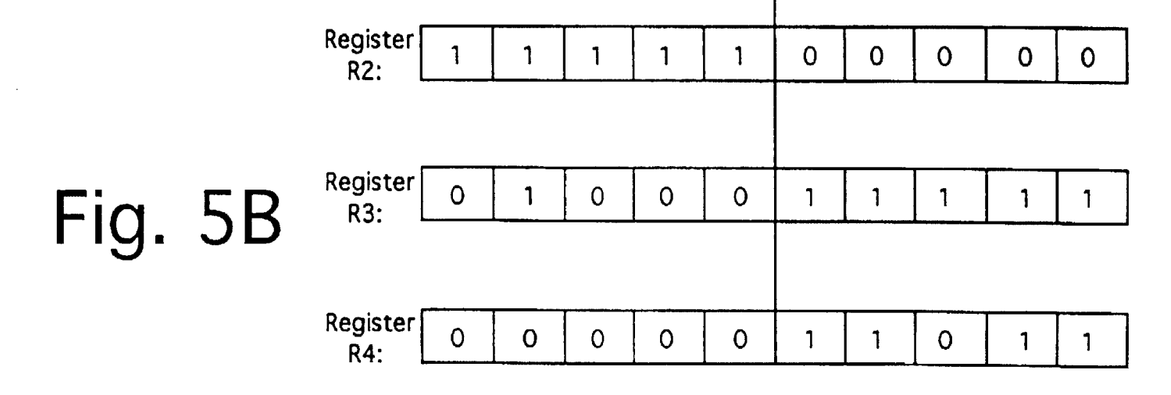

The sequence 1) to 4) is very simple to program as described herein and is further illustrated in FIGS. 5A–5B. Registers R1 and R2 are output via the I/O port device (410) and correspond to output (I) and tri state control (OEN), respectively. Register R3 is the input (0) received back from the I/O device (200). The registers are organized and utilized as described hereafter with reference to FIGS. 5A–B.

Referring now to FIG. 5A:

Initialization:
    set R1 to 'b0000011111 (R1–R5 forced to "zero" & C1–C5 to "weak one")
    set R2 to 'b0000000000 (all outputs low impedance R1–R5 low C1–C5 high)

Keyboard scan routine:
    set R2 to 'b0000011111 (R1–R5 forced low & C1–C5 to "weak one")
    wait for interrupt Referring now to FIG. 5B:

read and store R3 to R4.
set R2 to 'b1111100000 (R1–R5 to "weak zero & C1–C5 forced high)"
read R3
process R3 and R4 to decode the activated Key and then return to the scan routine after time out.

The register contents of FIGS. 5A–5B also illustrate the detection of switch (330), FIG. 5A, register R3 (and FIG. 5B—register R4), showing the C3 line detect ["0000011011"], and FIG. 5B, register R3 showing the R2 line detect ["0100011111"].

A low power circuit and method is thus provided for determining activation of a switch of a plurality of switches arranged in a switch matrix in rows and columns, where the switch matrix is coupled to a plurality of input/output devices each having an output line, the plurality of input/output devices comprising a row set and a column set, each of the output lines of the row set intersecting the output lines of the column set at different nodes. In summary, the method comprises the steps of:

a) changing the outputs of the column set of input/output devices (200) to a low impedance state;

b) inputting a logical high to the input/output devices of the column set;

c) changing the outputs of the input/output devices of the column set to a high d) retaining the logical high on the column lines in a repeater circuit coupled to the output of each input/output device in the column set;

e) changing the outputs of the row input/output devices to a low impedance f) inputting a logical low to the input/output devices of the row set;

g) detecting a change of state in the repeater circuits of the column set;

h) changing the outputs of the input/output devices of the row set to a logical low level low impedance state;

i) changing the outputs of the input/output devices of the row set to a high impedance state;

j) retaining the logical low on the row line in a repeater circuit coupled to the output of each input/output device in the row set;

k) changing the outputs of the input/output devices of the column set to a logical high level low impedance state; and l) detecting the change of state in the repeater circuits of the row set.

The detected change in state of the repeaters of the rows and columns sets (as stored in registers R3 and R4) is then utilized to determine which switch of the plurality of switches was activated. The method operates equally well with the row and column sets reversed in the method flow.

The outputs of the input/output devices are changed from high to low impedance and low to high impedance responsive to a control signal input (OEN) of the input/output device (200).

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. A low power, switch activation scanner circuit for determining activation of a switch from within a plurality of switches comprising two sets arranged in a matrix fashion, a first switch set of the two sets comprising a plurality of rows, each row coupled to a respective row line, and a second switch set of the two sets comprising a plurality of columns, each column coupled to a respective column line, the plurality of rows and columns intersecting at a plurality of nodes, for coupling a respective row to a respective column at a respective node when a respective switch of the plurality of switches is activated, the circuit comprising:

a plurality of bidirectional input/output devices, the plurality of devices comprising two sets, a first device set coupling each of the devices in the first device set to a respective one of the plurality of row lines; and a second device set coupling each of the devices in the second device set to a respective one of the plurality of column lines, each input/output device having an output line coupled to a respective one of the row lines and column lines, said each input/output device comprising:

an input to the input/output device;

an output coupled to the output line;

an output control for controlling the output of the input/output device such that a predetermined control signal coupled to the output control alternatively enables one of an input signal coupled to the input to pass through to the output line, and placing the output of the input/output device in a high impedance state; and a repeater circuit, coupled to the output line of the input/output device, for holding on the output line a current signal level when the output of the input/output device is in the high impedance state.

2. The circuit of claim 1, wherein each of the plurality of switches are coupled to a different key of a keyboard.

3. The circuit of claim 1, wherein the input signal is one of either a logical high or a logical low.

4. The circuit of claim 1, wherein the predetermined control signal is one of either a logical high signal or a logical low signal, the logical high signal causing the output of the input/output device to take on high impedance characteristics and the logical low signal causing the output of the input/output device to take on a low impedance state.

5. The circuit of claim 1, wherein the repeater circuit is comprised of two inverter gates, each having an input and output, the two inverter gates coupled such that a first inverter gate has its output coupled in series to the input of a second inverter gate, and the output of the second inverter gate is coupled o the input of the first inverter gate which is also coupled to the output of the input/output device.

6. The circuit as in claim 1, further comprising decoder means, coupled to the outputs of the input/output devices for detecting changes in state of the repeaters, for decoding which of the plurality of switches is activated.

7. A low power method for determining activation of a switch of a plurality of switches arranged in a switch matrix in rows and columns, the switch matrix coupled to a plurality of input/output devices each having an output line, the plurality of input/output devices comprising a row set and a column set, each of the output lines of the row set intersecting the output lines of the column set at different nodes, the method comprising the steps of:

changing the outputs of the column set of input/output devices to a low impedance state;

inputting a logical high level signal to the input/output devices of the column set;

changing the outputs of the input/output devices of the column set to a high impedance state;

retaining the logical high level signal in a repeater circuit coupled to the output of each input/output device in the column set;

changing the outputs of the row input/output devices to a low impedance state;

inputting a logical low level signal to the input/output devices of the row set;

detecting a change of state in the signal level of the repeater circuits of the column set;

changing the outputs of the row sets of input/out devices to a low impedance state;

inputting a logical low level signal to the input/output devices of the row set;

changing the outputs of the input/output devices of the row set to a high impedance state;

retaining the logical low level signal in a repeater circuit coupled to the output of each input/output device in the column set;

changing the outputs of the column input/output devices to a low impedance state;

inputting a logical high level signal to the input/output devices of the row set; and detecting the change of state in the repeater circuits of the row set.

8. The method of claim 7, further comprising the step of decoding the detected change of state in the repeaters of the row set and of the column set to determine which switch of the plurality of switches was activated.

9. The method of claim 7, wherein the outputs of the input/output devices are changed from high to low impedance and low to high impedance responsive to a control signal input to a control signal input of the input/output device.

10. The method of claim 7, further comprising the steps of:

storing the signal levels of the repeaters upon detecting the change of state; and decoding the activated switch node responsive to the stored signal levels.

11. A low power method for determining activation of a switch of a plurality of switches arranged in a switch matrix of rows and columns, the switch matrix coupled to a plurality of input/output devices each having an output line, the plurality of input/output devices comprising a row set and a column set, each of the output lines of the row set intersecting the output lines of the column set at different nodes, the method comprising the steps of:

changing the outputs of the column input/output devices to a low impedance state;

inputting a logical low to the input/output devices of the column set;

changing the outputs of the input/output devices to a high impedance state;

retaining the logical low in a repeater circuit coupled to the output of each input/output device;

changing the outputs of the row input/output devices to a low impedance state;

inputting a logical high to the input/output devices of the row set;

detecting a change of state in the repeater circuits of the column set;

changing the outputs of the row input/output devices to a high impedance state;

changing the outputs of the column input/output devices to a low impedance state; and detecting the change of state in the repeater circuits of the row set.

12. A keyboard switch activation detection system comprising:

a keyboard, coupled to the input/output circuit, for inputting data, the keyboard comprising a plurality of switches, each key of the keyboard being coupled to a different switch;

a low power, switch activation circuit for determining activation of a keyboard switch, the switch activation circuit comprising:

a plurality of bidirectional input/output devices, the plurality of devices comprising two sets arranged in a matrix fashion, a first set of the two sets comprising a plurality of rows and a second set of the two sets comprising a plurality of columns, each input/output device comprising:

an input coupled to the input/output circuit;

an output coupled to an output line, each row output line intersecting each column output line at a different node, a first row output line shorting to a first column output line in response to activation of a first key of the keyboard;

an output control, coupled to the processor, for controlling the output of the input/output device such that a first predetermined control signal coupled to the output control enables a signal coupled to the input to pass through to the output and a second predetermined control signal causes the respective input/output device output to go to a high impedance state; and a repeater circuit, coupled to the output of the input/output device, for holding a signal level value present at the output in response to the device output being in a high impedance state;

a processor, for decoding activation of a specific keyboard switch responsive to detecting changes in state of the repeater circuit values at the output.

13. A low power, switch activation scanner circuit for determining activation of a switch from a plurality of switches arranged as a matrix of columns and rows, for coupling a first row to a first column at a first node when a first switch of the plurality of switches is activated, the circuit comprising:

a plurality of bidirectional input/output devices, the plurality of devices comprising two sets arranged in a matrix fashion, a first set of the two sets comprising a plurality of rows and a second set of the two sets comprising a plurality of columns, each input/output device comprising:

an input to the input/output device;

an output coupled to an output line, each row output line intersecting each column output line at a different node;

an output control for controlling the output of the input/output device such that a predetermined control signal coupled to the output control enables a signal coupled to the input to pass through to the output; and a repeater circuit, coupled to the output of the input/output device, for holding a predetermined value from the input in response to the output control.

14. A user input apparatus comprising:

a switch matrix, comprised of a plurality of switches, comprising two sets arranged in a matrix fashion, a first set of the two sets comprising a plurality of rows and a second set of the two sets comprising a plurality of columns, the plurality of rows and columns intersecting at a plurality of nodes, for coupling a respective row to a respective column at a respective node when a respective switch of the plurality of switches is activated, wherein all switches in each respective row and column are adapted for common coupling when activated to a respective switch matrix line for the respective row and column;

a plurality of bidirectional input/output devices coupled to the switch matrix lines, the plurality of bidirectional input/output devices comprised of two sets, a first set coupling each device in the set to a respective one of the line for the plurality of rows and a second set coupling each device in the set to a respective one of the lines for the plurality of columns, each input/output device comprised of:

(a) an input to the input/output device;

(b) a device output coupled to a respective one of the lines;

(c) an output control for controlling the device output of the input/output device such that a predetermined control signal coupled to the output control enables an input signal coupled to the input to pass through to the device output and otherwise provides a high impedance output level to the device output of the input/output device;

(d) a received output coupled to the respective one of the lines for communicating a current logical level state of the respective line; and (e) a repeater circuit, coupled to the device output of the input/output device, for holding a most recent signal level present at the output in response to the device output providing the high impedance output level.

15. The apparatus as in claim 14, wherein the repeater circuit is further comprised of two inverter gates, each having an input and output, the two inverter gates coupled such that a first inverter gate has its output coupled in series to the input of a second inverter gate, and the output of the second inverter gate is coupled to the input of the first inverter gate which is also coupled to the respective device output of the input/output device.

16. The apparatus as in claim 14, further comprising:

means for applying logical high levels to the column lines by first driving corresponding I/O device outputs to low impedance logical high levels and then causing these outputs to go high impedance; and concurrently, driving the row lines to a low impedance logical low level;

wherein any valid key closure momentarily short circuits a row line to a column line and flips the corresponding column line repeater to a logical low level.

17. The apparatus as in claim 16, further comprising a column input port coupled to the column lines of the plurality of I/O devices, and means for reading the column input port.

18. The apparatus as in claim 17, further comprising:

means for detection of a change of state of the logical levels of the column line repeaters, for setting the row lines to logical low levels and then causing the corresponding device outputs to a high impedance state, and then driving the column lines to a low impedance high logic level;

wherein the key closure then couples the logical high level from the respective column line to the respective row line causing it to flip the signal level of the repeater coupled to the respective row line to the logical high level.

19. The apparatus as in claim 18, further comprising a row input port coupled to the row lines of the plurality of I/O devices; and means for reading the row input port.

20. The apparatus as in claim 19, further comprising:

means for identifying which of the plurality of switches is activated responsive to reading the row input port and the column input port.

21. The apparatus as in claim 14, further comprising:

a processor responsive to program instruction memory for output of the input and the control signals, and for reading the received outputs in a programmed sequence.

22. The apparatus as in claim 21, further comprised of storage registers R1, R2, R3, and R4, wherein the contents of the registers R1 and R2 are output to the input/output device and correspond to the input and output control signals, respectively, and wherein the register R3 stores received output received back from the input/output device.

23. The apparatus as in claim 22, further comprising:

initialization means for setting the contents of the register R1 to 0000011111, and setting the contents of the register R2 to 0000000000;

keyboard scan means, comprising means for setting the contents of the register R2 to 0000011111;

means for detecting a change of the contents of the register R3 relative to the contents of the register R1 contents;

means for reading the register R3 and storing its contents to the register R4 responsive to the means for detecting;

means for setting the contents of register R2 to 1111100000;

means for reading the contents of the register R3; and means for processing the contents of the registers R3 and R4 to decode the activated switch.

24. The apparatus as in claim 22, wherein the detected change in state of the repeaters of the rows and columns sets are stored respectively in registers R3 and R4, wherein said registers R3 and R4 are utilized to determine which of the plurality of switches was activated.

25. A low power method for determining activation of a switch of a plurality of switches arranged in a switch matrix in rows and columns, where the switch matrix is coupled to a plurality of input/output devices each having an output line, the plurality of input/output devices comprising a row set and a column set, each of the output lines of the row set intersecting the output lines of the column set at different nodes, the method comprising the steps of:

a) changing the outputs of the column set of input/output devices to a low impedance state;

b) inputting a logical high to the input(/output devices of the column set;

c) changing the outputs of the input/output devices of the column set to a high impedance state;

d) retaining the logical high on the column lines in a repeater circuit coupled to the output of each input/output device in the column set;

e) changing the outputs of the row input/output devices to a low impedance state;

f) inputting a logical low to the input/output devices of the row set;

g) detecting a change of state in the repeater circuits of the column set;

h) changing the outputs of the input/output devices of the row set to a logical low level low impedance state;

i) changing the outputs of the input/output devices of the row set to a high impedance state;

j) retaining the logical low on the row line in a repeater circuit coupled to the output of each input/output device in the row set;

k) changing the outputs of the input/output devices of the column set to a logical high level low impedance state; and l) detecting the change of state in the repeater circuits of the row set.

26. The method of claim 25, further comprising the step of determining which of the plurality of switches was activated responsive to the detecting of the change in state in the repeater circuits of the row set and the column set.

* * * * *